(12) United States Patent
Liu et al.

(10) Patent No.: US 8,559,142 B2
(45) Date of Patent: Oct. 15, 2013

(54) DC POWER SUPPLY INSULATION FAULT DETECTION CIRCUIT

(75) Inventors: Yow-Chyi Liu, Kaohsiung (TW); Jui-Kun Huang, Kaohsiung (TW)

(73) Assignee: Eneraiser Technology Co., Ltd., Kaohsiung (TW)

( * ) Notice: Subject to any disclaimer, the term of this patent is extended or adjusted under 35 U.S.C. 154(b) by 216 days.

(21) Appl. No.: 13/154,812

(22) Filed: Jun. 7, 2011

(65) Prior Publication Data
US 2012/0314327 A1 Dec. 13, 2012

(51) Int. Cl.
*H02H 9/08* (2006.01)
*H02H 9/00* (2006.01)
*G01R 31/14* (2006.01)
*G01R 27/08* (2006.01)

(52) U.S. Cl.
USPC ................ 361/42; 361/56; 324/509; 324/691

(58) Field of Classification Search
USPC ................................ 361/42, 56; 324/509, 691
See application file for complete search history.

(56) References Cited

U.S. PATENT DOCUMENTS

| 4,253,056 | A  | * | 2/1981 | Chaudhary | 324/509 |
| 7,049,825 | B2 | * | 5/2006 | Carruthers | 324/509 |
| 8,232,806 | B2 | * | 7/2012 | Kawamura | 324/509 |
| 2003/0155928 | A1 | * | 8/2003 | Roden et al. | 324/509 |
| 2004/0189330 | A1 | * | 9/2004 | Herb et al. | 324/691 |
| 2005/0151658 | A1 | * | 7/2005 | Kono et al. | 340/647 |

* cited by examiner

*Primary Examiner* — Scott Bauer
(74) *Attorney, Agent, or Firm* — Muncy, Geissler, Olds & Lowe, PLLC

(57) ABSTRACT

A DC power supply insulation fault detection circuit includes a plurality of circuit breaking elements located at a positive terminal and a negative terminal of each circuit in a power supply system, at least one leakage current detector located in the circuit, and at least one positive voltage transient compensator and at least one negative voltage transient compensator respectively bridging the positive terminal and negative terminal of the power supply system. The positive and negative voltage transient compensators respectively include a charge/discharge circuit to allow an energy storage circuit to be charged. When grounding insulation deterioration takes place at the positive or negative terminal of the leakage current detector, a leakage current loop is formed so that energy storage elements discharge and the leakage current detector detects current variations on the positive and negative terminals, and issue an alarm signal or control cutoff of the circuit breaking elements.

6 Claims, 6 Drawing Sheets

DC POWER SUPPLY INSULATION FAULT DETECTION CIRCUIT

FIELD OF THE INVENTION

The present invention relates to a DC power supply insulation fault detection circuit and particularly to a circuit to perform automatic online detection of current leakage in various circuits during DC power supply operation.

BACKGROUND OF THE INVENTION

Please refer to FIG. 1 for a conventional technique to detect insulation deterioration of an ungrounded-type or high-impedance grounded-type DC power supply system 9. It includes a grounding alarm device 92 on a power source 91 to measure voltage alterations of the positive terminal and negative terminal of the power supply system 9 respectively against the ground terminal to determine whether circuits of total power supply system 9 have abnormal conditions of insulation deterioration against the ground terminal.

In the event that the power supply system 9 includes a plurality of shunt circuits 93, and one of the shunt circuits 93 has a grounding fault 94 due to insulation deterioration, the grounding alarm device 92 detects the grounding fault 94 and provides an alarm signal by measuring the voltage difference between the positive terminal or the negative terminal of the power supply system 9 and the ground terminal so that the power supply system has to be shut down to inspect insulation of every shunt circuit 93 to identify where the grounding fault 94 occurs. There is no automatic online detection and alarm for the grounding fault 94 of the shunt circuit 93, nor instant cutoff of power supply to the shunt circuit 93 having the grounding fault 94.

SUMMARY OF THE INVENTION

The primary object of the present invention is to provide a DC power supply insulation fault detection circuit to overcome the shortcomings of the conventional ungrounded-type or high-impedance grounded-type power supply system that is unable to provide high sensitive leakage current detection and alarm and to determine which circuit has the grounding fault when a grounding fault or insulation deterioration occurs in the power supply system.

To achieve the foregoing object, the present invention adopts technique as follows:

Provide a DC power supply insulation fault detection circuit which includes a plurality of circuit breaking elements, at least one leakage current detector, at least one positive voltage transient compensator and at least one negative voltage transient compensator. The circuit breaking elements are located at a positive terminal and a negative terminal of a circuit in a power supply system. The leakage current detector is located in the circuit of the power supply system. The positive voltage transient compensator includes a first charge/discharge circuit, a first energy storage circuit, and a first discharge circuit. The first charge/discharge circuit includes a first resistor which has one end connected to the positive terminal of the power supply system and another end coupled with the first energy storage circuit in series. The first energy storage circuit has another end grounded and includes a resistor and a first energy storage element coupled in parallel. The first discharge circuit is coupled with the first charge/discharge circuit in parallel, and includes a first one-way discharger and a resistor coupled in series. The negative voltage transient compensator is includes a second charge/discharge circuit, a second energy storage circuit, and a second discharge circuit. The second charge/discharge circuit includes a second resistor which has one end connected to the negative terminal of the power supply system and another end coupled with the second energy storage circuit in series. The second energy storage circuit has another end grounded and includes a resistor and a second energy storage element coupled in parallel. The second discharge circuit is coupled with the second charge/discharge circuit in parallel, and includes a second one-way discharger and a resistor coupled in series.

The positive and negative voltage transient compensators can also be respectively formed in another circuit type with multiple positive voltage transient compensators and multiple negative voltage transient compensators respectively located in the circuit of the power supply system; namely each circuit of the power supply system has a positive voltage transient compensator and a negative voltage transient compensator.

The positive and negative voltage transient compensators of the invention are located on a DC bus of the power supply system to incorporate with the leakage current detector of the circuit to detect leakage current.

The invention thus formed can overcome the detection blind spot of insulation deterioration against the ground terminal in the conventional DC power supply system. Through the first resistor of the first charge/discharge circuit of the positive voltage transient compensator, the first energy storage circuit can be charged to store electric energy. In the event that insulation deterioration against the ground terminal occurs to the positive terminal at the power output side of the leakage current detector, leakage current passes through the ground net and first energy storage element to be grounded to form a leakage current loop. The first energy storage element discharges through the first one-way discharger of the first discharge circuit so that the leakage current detector can detect current variations passing through the positive terminal and negative terminal and issue an alarm signal or control cutoff of the circuit breaking elements to stop supplying power to the circuit. Thus a high sensitive detection is accomplished, and operators can instantly aware of the abnormal condition of insulation deterioration against the ground terminal in the circuit, therefore an instant online leakage current alarm of the circuit can be obtained during operation. In the event that the leakage current detector detects that insulation deterioration against the ground terminal takes place at the negative terminal at the power output side, the leakage current flows back to the ground terminal of the negative voltage transient compensator, and also can achieve the same detection purpose.

In short, the DC power supply insulation fault detection circuit of the invention provides many benefits, notably:

1. The leakage current detector can provide high sensitive detection through the voltage transient compensators.
2. The leakage current detector in each circuit can provide automatic online alarm for insulation deterioration condition against the ground terminal.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENTS

Figure 1:
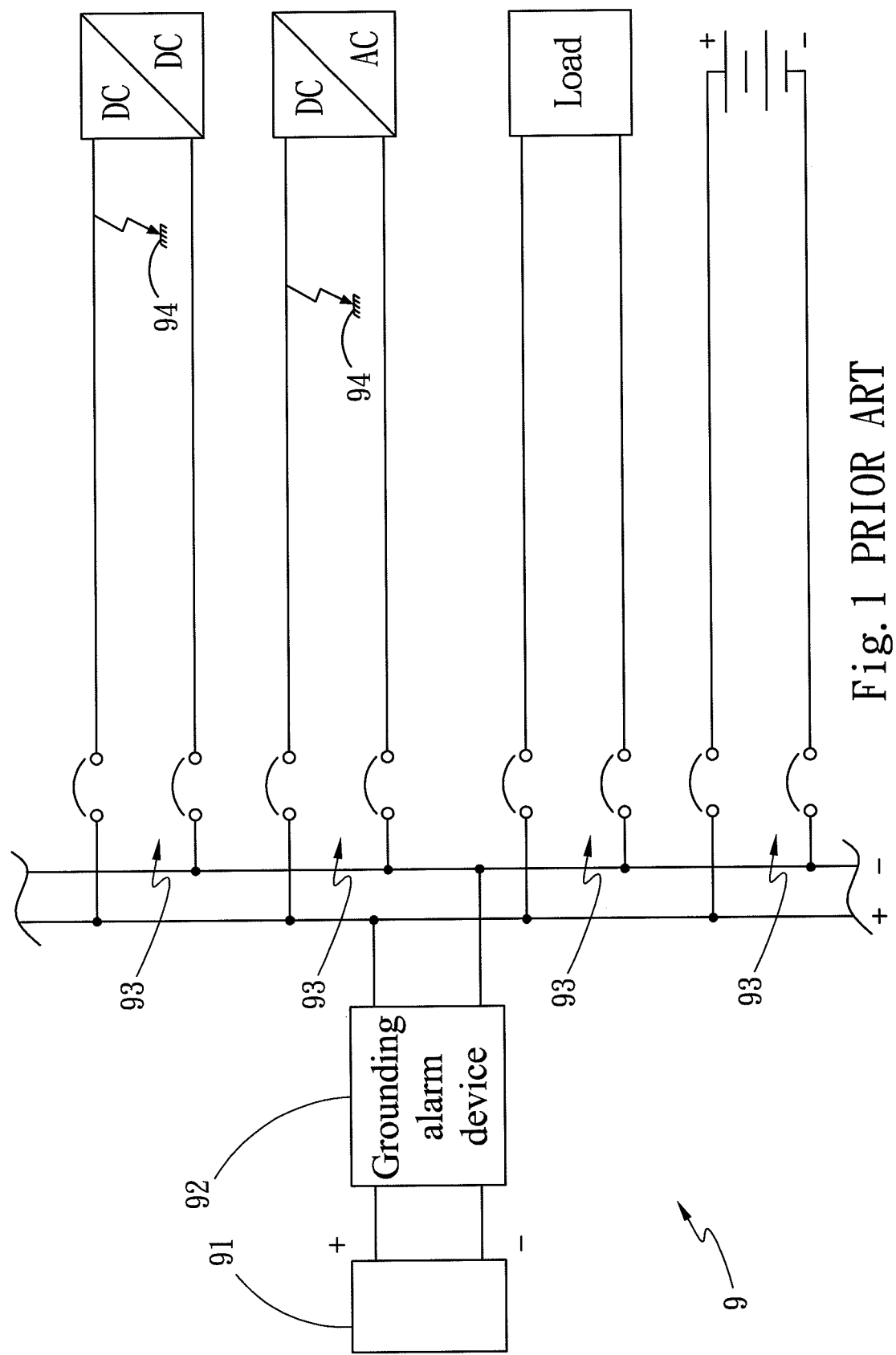
FIG. 1 is a circuit diagram of a conventional DC power supply system for detecting grounding fault through the voltage of a positive terminal and a negative terminal against the ground terminal.
Figure 2:
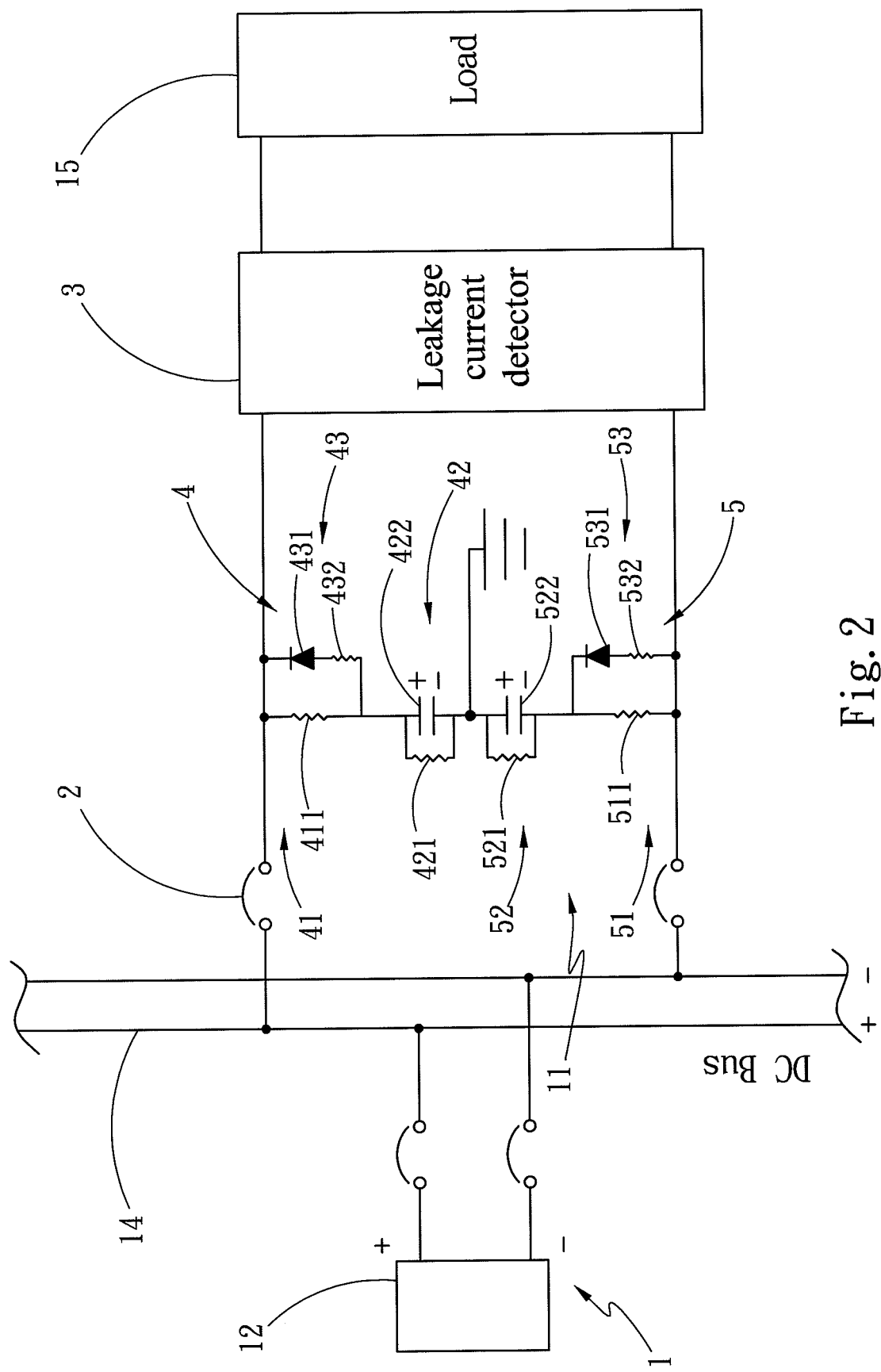
FIG. 2 is a circuit diagram of the DC power supply insulation fault detection circuit according to the invention.
Figure 3:
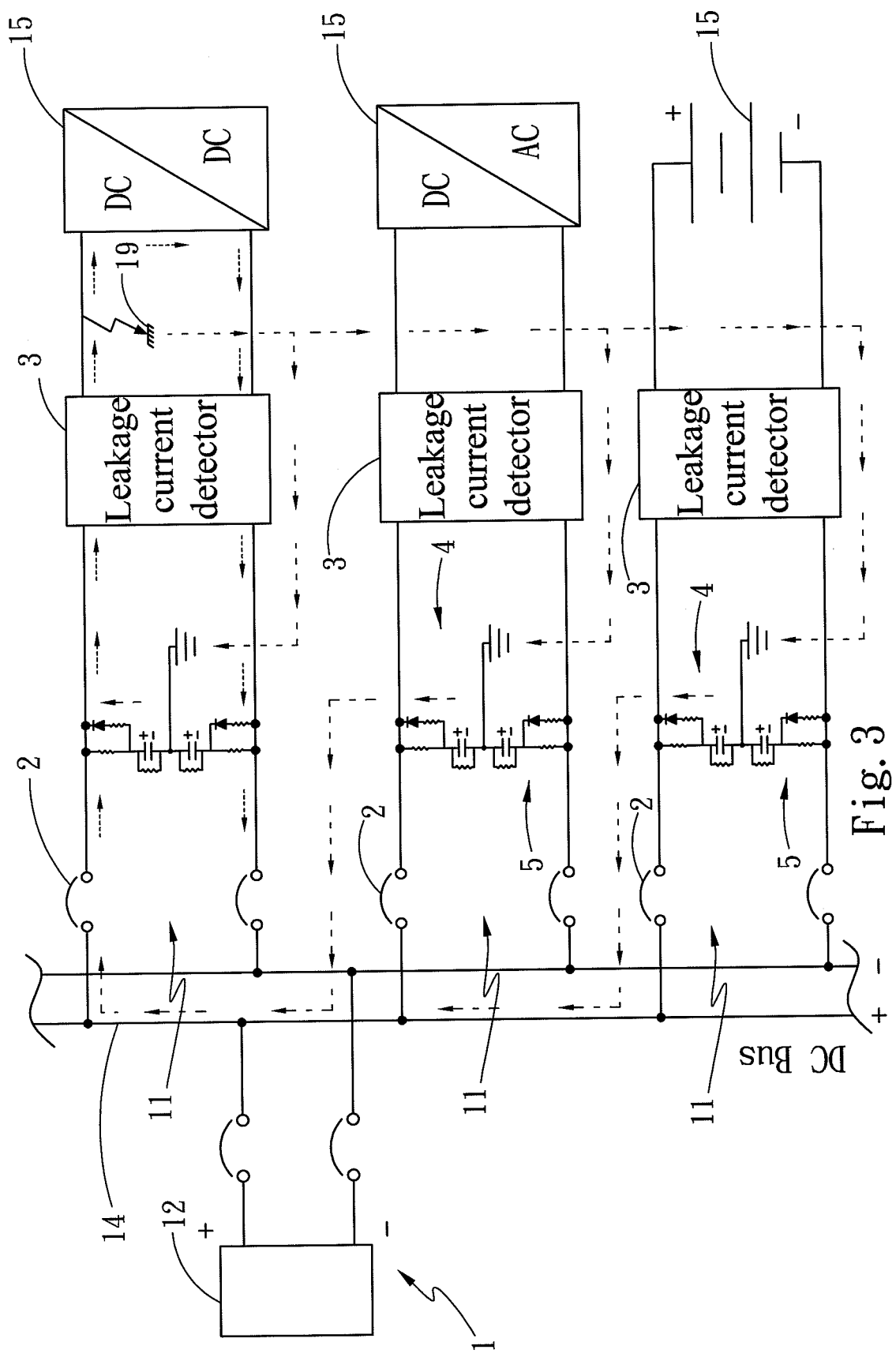
FIG. 3 is a schematic view showing leakage current flowing directions with the invention located in various circuits.

Please refer to FIGS. 2 and 3, the present invention aims to provide a DC power supply insulation fault detection circuit which includes:

a plurality of circuit breaking elements 2 located at a positive terminal and a negative terminal of a circuit 11 in a power supply system 1 to cut off power supply to the circuit 11 when desired;

a plurality of leakage current detectors 3 respectively located in the circuit 11 of the power supply system 1 to detect leakage current values of the circuit 11, and issue an alarm signal or control cutoff of the circuit breaking elements 2 to stop supplying power to the circuit 11 when detecting an abnormal leakage current;

a plurality of positive voltage transient compensators 4 respectively located in the circuit 11 of the power supply system 1; each positive voltage transient compensator 4 includes a first charge/discharge circuit 41, a first energy storage circuit 42, and a first discharge circuit 43. The first charge/discharge circuit 41 includes a first resistor 411 which has one end connected to the positive terminal of the power supply system 1 and another end coupled with the first energy storage circuit 42 in series. The first energy storage circuit 42 has another end grounded. The first energy storage circuit 42 includes a resistor 421 and a first energy storage element 422 coupled in parallel. The first discharge circuit 43 is coupled with the first charge/discharge circuit 41 in parallel, and includes a first one-way discharger 431 and a resistor 432 coupled in series; and a plurality of negative voltage transient compensators 5 respectively located in the circuit 11 of the power supply system 1; each negative voltage transient compensator 5 includes a second charge/discharge circuit 51, a second energy storage circuit 52, and a second discharge circuit 53. The second charge/discharge circuit 51 includes a second resistor 511 which has one end connected to the negative terminal of the power supply system 1 and another end coupled with the second energy storage circuit 52 in series. The second energy storage circuit 52 has another end grounded. The second energy storage circuit 52 includes a resistor 521 and a second energy storage element 522 coupled in parallel. The second discharger circuit 53 is coupled with the second charge/discharge circuit 51 in parallel, and includes a second one-way discharger 531 and a resistor 532 coupled in series.

The first and second charge/discharge circuits 41 and 51 of the positive and negative voltage transient compensators 4 and 5 allow the first and second energy storage elements 422 and 522 to be charged through the resistors 421 and 521 to store electric energy. The first and second discharge circuits 43 and 53 allow the first and second energy storage circuits 42 and 52 to discharge electricity through the first and second one-way dischargers 431 and 531 when insulation deterioration 19 against the ground terminal takes place.

Referring to FIG. 3, when the circuit 11 is in operation and the positive or negative terminal at a power output side 15 of the leakage current detector 3 has insulation deterioration 19 against the ground terminal, leakage current passes through a ground net and the first and second energy storage elements 422 and 522 to be grounded to form a leakage current loop. The first and second energy storage elements 422 and 522 discharge through the first and second one-way dischargers 431 and 531 so that the leakage current detector 3 detects current variations passing through the positive terminal and negative terminal, and issues an alarm signal or controls the cutoff of the circuit breaking elements 2 to stop supplying power to the circuit 11. Therefore, a high sensitive detection can be accomplished, and operators can be alerted instantly about the abnormal insulation deterioration 19 against the ground terminal in the circuit 11.

Figure 4:
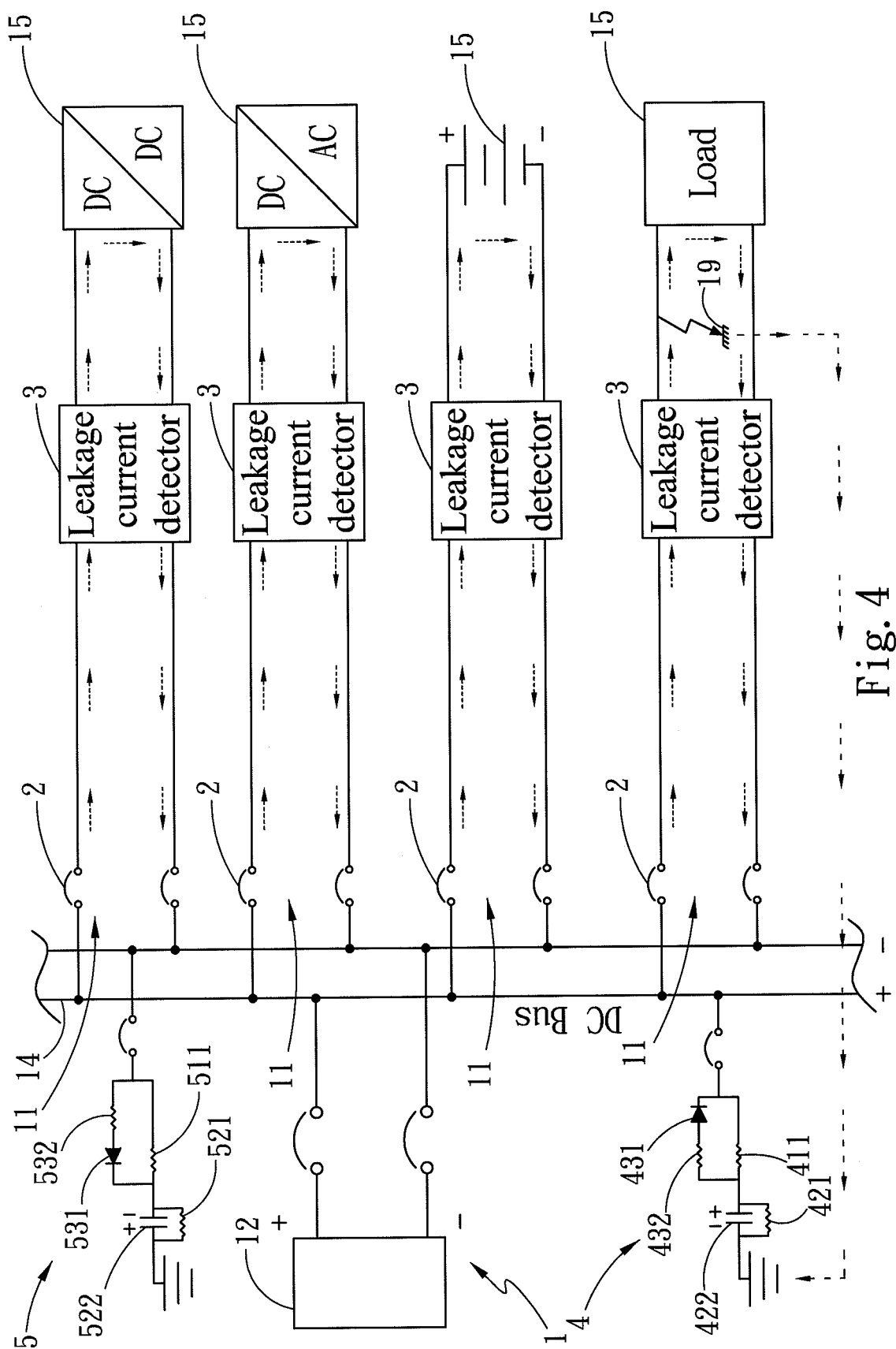
FIG. 4 is a schematic view showing leakage current flowing directions with the invention located on a DC bus.

Please refer to FIG. 4 for an embodiment of the invention. The power supply system 1 has a DC bus 14 containing one positive voltage transient compensator 4 and one negative voltage transient compensator 5 to provide a common path for the leakage current loops of the circuits 11 so that the leakage current detector 3 can successfully detect the leakage current.

Figure 5:
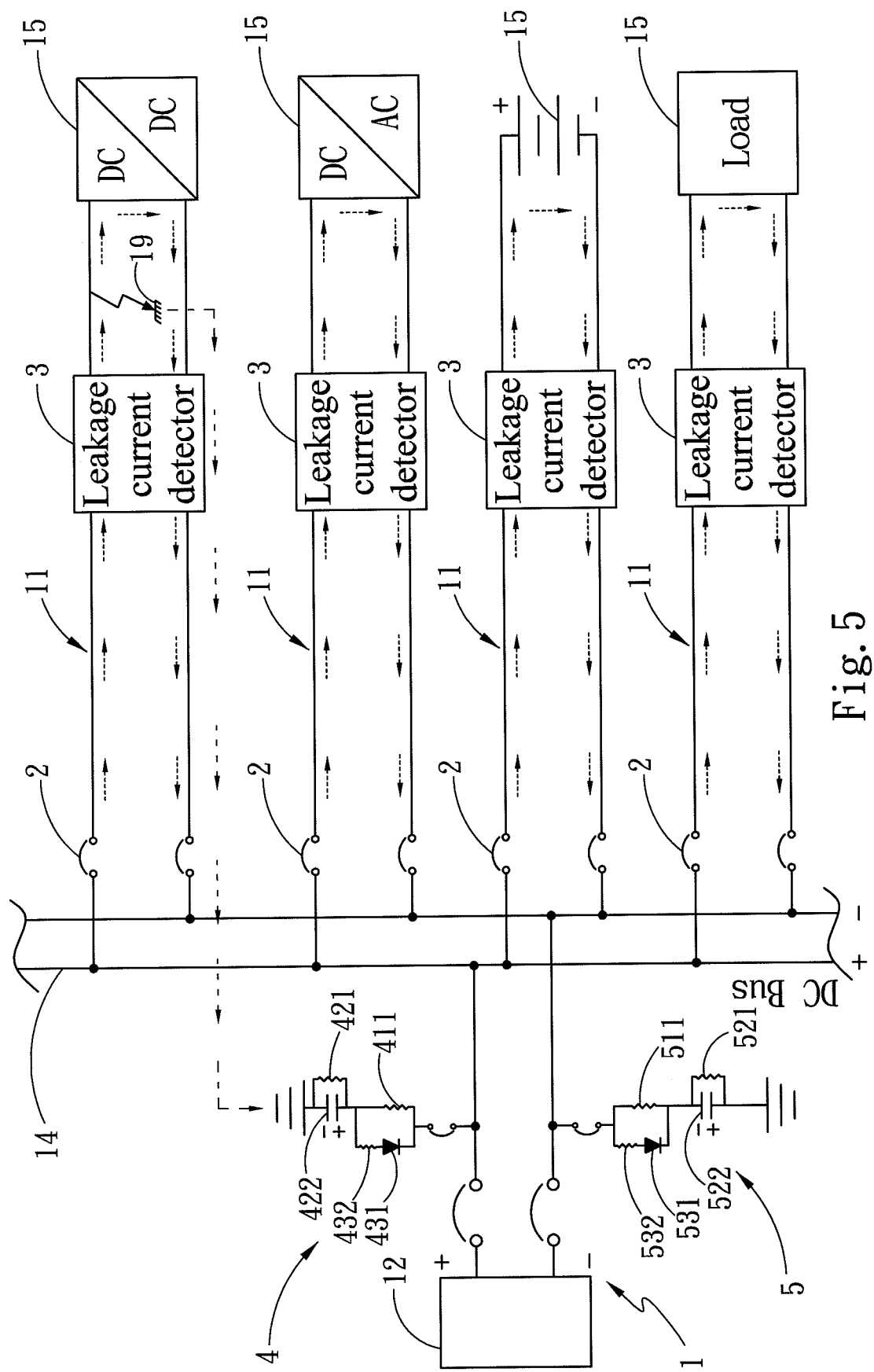
FIG. 5 is a schematic view showing leakage current flowing directions with the invention located between a power source and a DC bus.

FIG. 5 illustrates another embodiment in which a positive voltage transient compensator 4 and a negative voltage transient compensator 5 are respectively located between the power source 12 and DC bus 14 of the power supply system 1, thus the leakage current loop also is provided.

Figure 6:
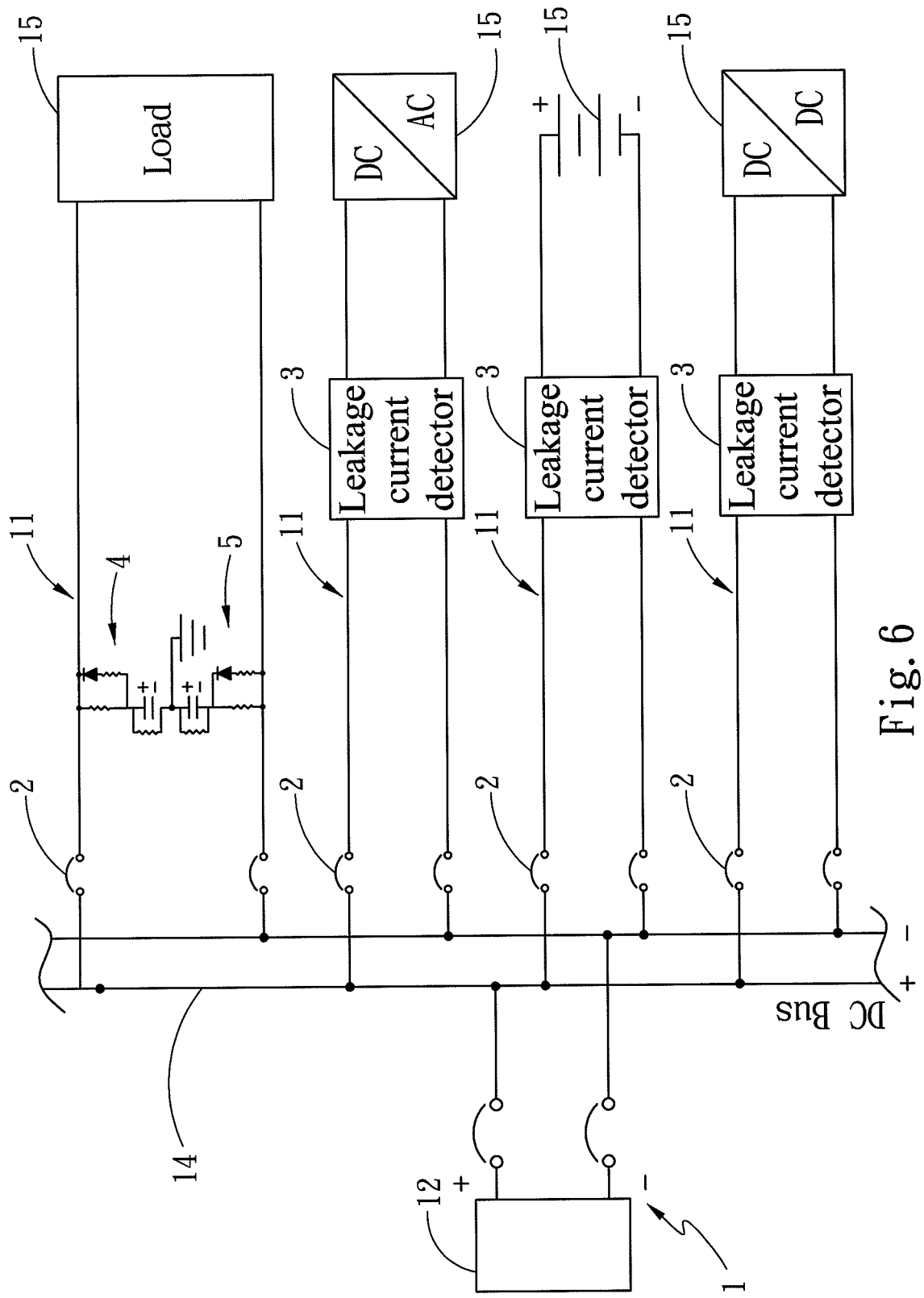
FIG. 6 is a circuit diagram of a single circuit of the invention.

Referring to FIG. 6, a positive voltage transient compensator 4 and a negative voltage transient compensator 5 are located in a circuit 11 without being equipped with a leakage current detector 3 but also providing a leakage current loop since other leakage current detectors 3 in the circuits 11 still provide leakage current detection function.

What is claimed is:

1. A DC power supply insulation fault detection circuit, comprising:

at least one leakage current detector located in a circuit of a power supply system to detect leakage current of the circuit;

at least one positive voltage transient compensator which includes a first charge/discharge circuit and a first energy storage circuit, the first charge/discharge circuit including a first resistor which has one end connected to a positive terminal of the power supply system and another end coupled with the first energy storage circuit in series, the first energy storage circuit having another end grounded and including a resistor and a first energy storage element coupled in parallel; and at least one negative voltage transient compensator which includes a second charge/discharge circuit and a second energy storage circuit, the second charge/discharge circuit including a second resistor which has one end connected to a negative terminal of the power supply system and another end coupled with the second energy storage circuit in series, the second energy storage circuit having another end grounded and including a resistor and a second energy storage element coupled in parallel, wherein the first charge/discharge circuit of the positive voltage transient compensator is coupled with a first discharge circuit in parallel, the first discharge circuit including a first one-way discharger.

2. The DC power supply insulation fault detection circuit of claim 1, wherein the circuit of the power supply system includes the positive voltage transient compensator and the negative voltage transient compensator.

3. The DC power supply insulation fault detection circuit of claim 1, wherein the positive voltage transient compensator and the negative voltage transient compensator are located on a DC bus of the power supply system.

4. The DC power supply insulation fault detection circuit of claim 1, wherein the first one-way discharger of the first discharge circuit is coupled with a resistor in series.

5. The DC power supply insulation fault detection circuit of claim 1, wherein the second charge/discharge circuit of the negative voltage transient compensator is coupled with a second discharge circuit in parallel, the second discharge circuit including a second one-way discharger.

6. The DC power supply insulation fault detection circuit of claim 5, wherein the second one-way discharger of the second discharge circuit is coupled with a resistor in series.

* * * * *